United States Patent
Thanhauser et al.

(10) Patent No.: US 7,245,226 B1
(45) Date of Patent: Jul. 17, 2007

(54) INTEGRATED MICROPROCESSOR CONTROLLED ALARM

(75) Inventors: Albert S. Thanhauser, Stamford, CT (US); Russell W. Sherwood, Olathe, KS (US)

(73) Assignee: Longwood Corporation, Riverdale, NY (US)

( * ) Notice: Subject to any disclaimer, the term of this patent is extended or adjusted under 35 U.S.C. 154(b) by 45 days.

(21) Appl. No.: 10/936,320

(22) Filed: Sep. 8, 2004

(51) Int. Cl.
*G08B 21/00* (2006.01)

(52) U.S. Cl. ............... 340/660; 340/693.1; 340/693.4; 340/692; 340/691.1; 340/691.8; 340/506; 340/331; 340/332

(58) Field of Classification Search ................ 340/660, 340/693.1, 693.4, 692, 691.1, 691.8, 506, 340/286.05, 331, 332
See application file for complete search history.

(56) References Cited

U.S. PATENT DOCUMENTS

| | | | |
|---|---|---|---|
| 3,173,136 A | 3/1965 | Atkinson | |
| 3,579,233 A * | 5/1971 | Raschke | 340/384.72 |
| 3,934,084 A | 1/1976 | Munson et al. | |
| 3,934,085 A | 1/1976 | Munson et al. | |
| 3,981,007 A | 9/1976 | Cieslak et al. | |
| 4,056,741 A | 11/1977 | Hoerz et al. | |
| 4,086,589 A | 4/1978 | Cieslak et al. | |
| 4,603,317 A | 7/1986 | Gailbreath et al. | |
| 4,668,937 A | 5/1987 | Shots | |
| 4,724,424 A | 2/1988 | Nakashima et al. | |
| 4,825,211 A | 4/1989 | Park | |
| 4,881,058 A * | 11/1989 | Berry, III | 340/326 |
| 5,077,799 A * | 12/1991 | Cotton | 381/57 |
| 5,444,783 A * | 8/1995 | Na | 381/57 |
| 5,563,586 A * | 10/1996 | Baum et al. | 340/3.5 |
| 5,751,210 A * | 5/1998 | Kosich | 340/293 |
| 5,786,760 A | 7/1998 | Suzuki et al. | |

* cited by examiner

*Primary Examiner*—Tai Nguyen
(74) *Attorney, Agent, or Firm*—Sturm & Fix LLP

(57) ABSTRACT

Alarms are often required on various vehicles and equipment such as fork lifts, dump trucks, bulldozers, etc. An alarm is disclosed controlled by a microprocessor, which is an integral part of the basic circuit. The alarm has a flat diaphragm, and a novel acoustic lens. The acoustic lens is constructed such that sound emanating from the center of the diaphragm has a direct path to the outside of the alarm. Sound produced around the periphery of the diaphragm must pass through a path containing switchbacks, that serve as an acoustic delay line, so this sound is delayed in exiting the alarm. The result is an alarm that with full sound in the important regions such as behind and to the side rear of the vehicle, but is very quiet for the operator or driver of the vehicle. The microprocessor is relied upon for adjusting alarm output based on source voltage and varying the signal based on ambient noise, as well as specific signals for particular applications.

18 Claims, 4 Drawing Sheets

INTEGRATED MICROPROCESSOR CONTROLLED ALARM

CROSS REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

1. Field of the Invention

The present invention relates generally to an alarm. More specifically, the present invention relates to a microprocessor controlled alarm having a unique spatial sound pattern to reduce the noise to persons having to be in close proximity to the alarm, such as an operator of a machine on which the alarm is mounted.

2. Background Art

Alarms are used on mobile machinery and vehicles to warn persons of the danger they may present. Such machinery is used in construction, mining, industrial, and warehouse applications, for instance. Some alarms are sounded only when the vehicle is backed up. An operator of such machinery, such as a fork lift, back hoe, crawler, etc., is subject to the noise of the alarm. Conventional alarms have no particular protection for the operator from intense sound. As a consequence, alarms are often disabled by operators so as to alleviate themselves of the discomfort caused by the noise.

Present day alarms require variable amplifiers and different control circuits for different applications. So, an alarm to be placed on a fork lift used inside a low-ceiled building would be quite different from an alarm placed on a bulldozer used only out in the open in a landfill.

A variable volume horn system for vehicles was disclosed in U.S. Pat. No. 3,173,136 by Atkinson. The horn of Atkinson automatically adjusts its signal level based on the ambient noise. The adjustability is effected using a variable output amplifier.

Munson, et al., (U.S. Pat. No. 3,934,085) also disclose a variable volume horn system. This invention also includes a sensor to determine the volume of the horn signal, and a logic unit to adjust the volume whenever the volume drops below a predetermined level.

A more recent invention for a horn used on moving vehicles is that of Gailbreath, et al., in U.S. Pat. No. 4,603,317. This invention, again, adjusts its signal level based on the ambient noise level. The alarm of the Gailbreath, et al., patent has selectable sound patterns to make the alarm distinguishable from surrounding noise.

In the above patents, no novel housing, or acoustic lens, shapes for the audio transducer are specified. Most such systems utilize a highly directional, truncated horn or similar for the housing; or their goal is a sound pattern that is essentially the same in all directions.

Another issue, not addressed in the prior art, is that of supply voltage. When the alarm supply voltage varies, the usual result is a varying alarm signal, even to the point of being unsatisfactory or failure of the alarm.

Still another facet of the prior art is the shape of the diaphragm and arrangement used in the transducer of an alarm system. The prior art is profuse with dome shaped diaphragms for loudspeakers. For high-fidelity applications, a voice coil is utilized that is not fused to the edge of the dome and the edges of the dome are couched in a well-damped surround to reduce distortion. There is a dearth of prior art alarm systems showing transducer assemblies having good environmental sealing and heat transfer, with the additional benefit of low cost. Current alarm designs have high cost associated with high output levels in almost direct proportion. High fidelity is not an important attribute for an alarm system of the present application.

There is a need, therefore, for a reliable alarm system using a microprocessor to provide functionality such as variable signal level based on the ambient noise, accommodation of varying source voltage, and a plurality of alarm signal types, so the alarm is detectable among background noises. There is also a need for a mobile vehicle alarm system providing a strong alarm signal to the areas most in danger of the vehicle, such as behind the vehicle when it is being backed up, while protecting the operator of the vehicle from high signal strength that might cause hearing damage. An additional need is for a transducer design combining the attributes of good environmental sealing, good heat transfer and low cost, creating a high integrity design housing, allowing the alarm to meet the SAE and ANSI, etc. standard specifications and tests.

BRIEF SUMMARY OF THE INVENTION

The present invention is a warning alarm. It may be used in many applications where sonic annunciation is desired, and has capability for visual alerts such as a strobe. It may be used to warn of imminent machine activity which could pose physical hazards to nearby persons. Such alarms have a broad range of requirements for sound output level, generated tone character, environmental stability, and cost.

A purpose of this invention is to provide a method and apparatus for improving a sound pattern for a mobile vehicle alarm though a novel lens design. Sound is emitted directly from the center of a diaphragm through a first output path, while a second output path is followed by the sound emitted from a periphery of the diaphragm. The second output path comprises one or more "switchbacks" to form an acoustic delay line which delays the output of this sound. The result is an alarm with constant-energy curves that lie nearly completely in front of the alarm, which is usually behind the vehicle on which the alarm is mounted. The included angle of the constant-energy curves is about 180°.

Another purpose of this invention is to utilize a microprocessor as the principle component of the basic circuit to the vehicle alarm. The microprocessor is not merely a device controlling the basic circuit. The microprocessor may be used to vary the output of the alarm based on a sensed ambient noise level. Varying source voltages may be mitigated by the microprocessor as well. A variety of signal types may also be programmed into the microprocessor so that the alarm will be effective in a multitude of background noise situations. Different output frequency ranges may be selected based on either separation from ambient sound frequencies or compliance with standards.

Still another purpose of the present invention is to provide a novel transducer design having good environmental sealing, good heat transfer and low cost. In the preferred embodiment, the diaphragm is a metallic flat plate mounted around its periphery in rubber or foam O-rings. A voice coil is included to provide for loudspeaker utility.

The alarm of the present invention incorporates a microprocessor, providing all the functions normally provided by other circuitry, and at a greatly reduced cost, particularly at high output sound pressure levels, as well as simplicity with corresponding increased reliability. The microprocessor may be programmed to achieve all known functions associated with commercial alarms of this type. The microprocessor control element eliminates the need for variable amplifiers and different control circuits for varying applications, while further producing previously unachievable alarm characteristics and functions. Circuit components may be identical across a broad range of very diverse applications at a greatly reduced cost. Simple changes in programming provide functionality for different alarm applications.

The microprocessor alarm system is coupled to a unique transducer which utilizes modern inexpensive materials to construct an element which has a broad, useful frequency range while being very inexpensive. All moving components (the diaphragm assembly) are constructed of metallic materials and are thermally coupled to one another. This permits very high power handling because of large surfaces in contact with the air. The diaphragm, circuit board and magnet fit neatly into an inexpensive plastic housing and the diaphragm is held in place by foam or rubber O-rings by the front housing extension within the plastic housing.

The transducer is also used as a detector by the microprocessor and can be used to measure ambient sound pressure level and adjust alarm sound pressure level or tone output accordingly.

The housing extension has a particular shape which causes most of the sound to radiate in one half the spherical space on the axis of the extension. This allows the alarm to be positioned such that a human operator of a machine hears little sound from the alarm but other persons hear a much louder tone.

The electronics fit into the end of the housing opposite the extension, and are attached to the magnet. The housing rear cover holds the electronic printed circuit board and magnet in place. The housing is made from an inexpensive plastic such as PVC or ABS, glued or welded together. This housing, when assembled, becomes a sealed and environmentally stable package for the entire alarm.

The resulting alarm system is a highly integrated, high reliability, very low cost, programmable alarm, meeting the high-output, low-voltage alarm requirements of such alarm devices. Software control permits fulfillment of unforeseen future applications by simple programming changes without redesign. Low component count ensures low cost and increased reliability. Controlled acoustic radiation pattern and acoustic output level enhances human perception and localization of the alarm without interference to machine operators.

The novel features which are believed to be characteristic of this invention, both as to its organization and method of operation together with further objectives and advantages thereto, will be better understood from the following description considered in connection with the accompanying drawings in which a presently preferred embodiment of the invention is illustrated by way of example.

DETAILED DESCRIPTION OF THE INVENTION

Figure 1:
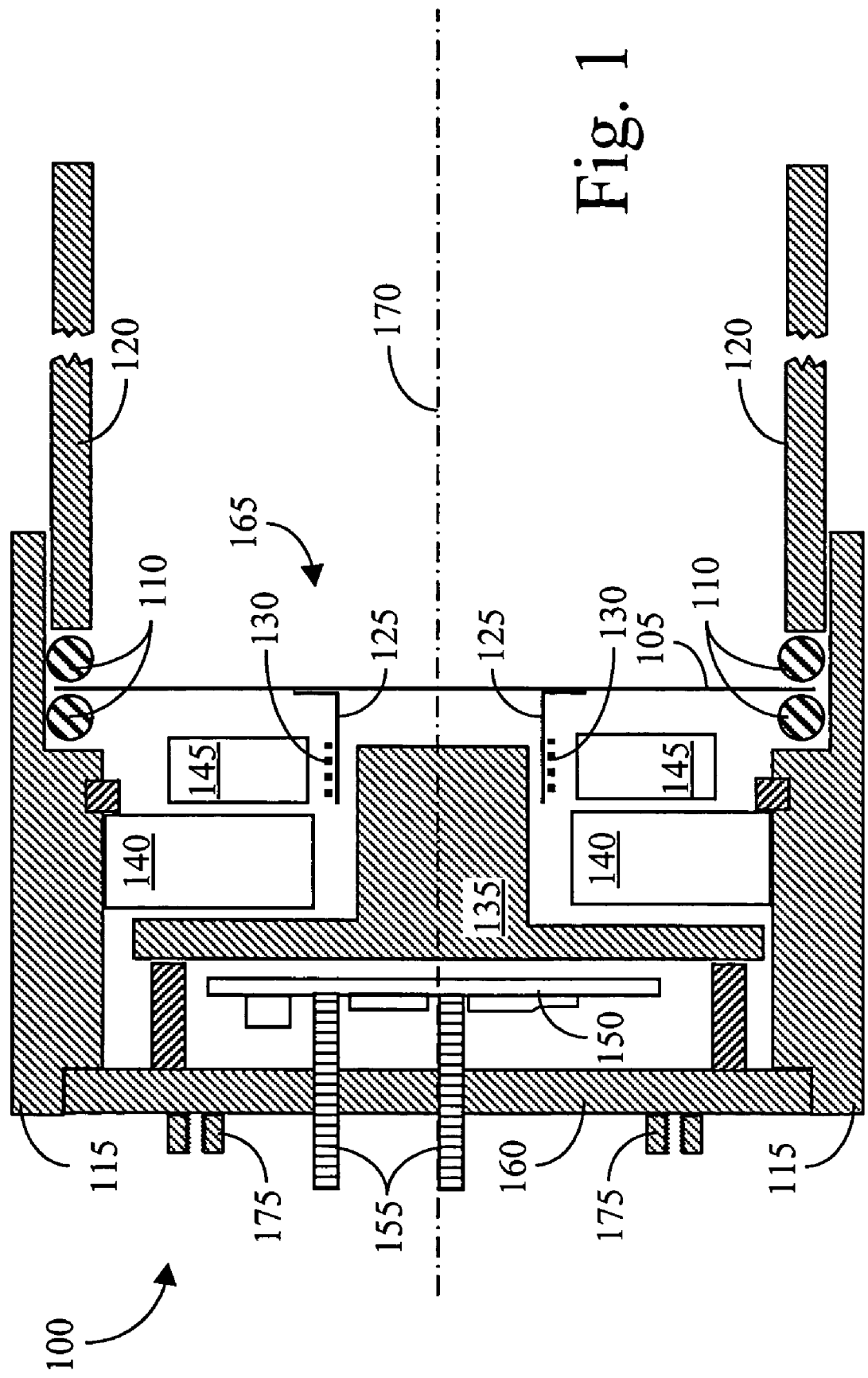
FIG. 1 is a cutaway view of a first embodiment of the alarm system of the present invention.

One novel aspect of the present invention is the use of a flat-plate diaphragm 105 as the major vibrating component of the completed alarm 100, as shown in FIG. 1. The diaphragm 105 is sandwiched between two O-rings 110 of elastic material such as rubber or foam. The O-rings, in turn, are held in place between the main housing 115 and the extension housing 120. The main housing 115 and the extension housing 120 are fused together using standard plastic to plastic glues or chemical weld.

A voice coil former 125 is rigidly affixed to the diaphragm 105 and is wound by the voice coil wires 130. A pole piece 135 is inserted into the center of the voice coil former 125. A magnet 140 provides the necessary permanent electromagnetic force while a top plate 145 structurally connects the magnet 140 and pole piece 135.

A printed circuit board 150 also resides in the main housing 115 for protection from the elements. The power to the printed circuit board 150 comes through connectors 155. A back cover 160 seals the electronics from dust and moisture outside the housing. Accommodations for threaded fasteners such as standoffs 175 or the like may optionally be provided to mount a strobe or similar visible alarm to the back of the alarm system 100.

The main housing 115, extension housing 120, diaphragm assembly 165, magnet 140, pole piece 135, top plate 145, and the back cover 160 are all symmetric about an axis of rotation 170.

In operation, the diaphragm 105 is vibrated by the interaction of a current through the voice coil wires 130, the voice coil former 125, the pole piece 135, and the diaphragm 105. The resulting alarm or voice sound waves travel through the extension housing 120, being focused to a predetermined region.

By gluing or welding the main housing 115, back cover 160, and extension housing 120 together, the alarm unit 100 is sealed from moisture and dirt outside the alarm system 100. It also provides the option of introducing a ferro fluid to the inside of the alarm housing to enhance cooling in high energy applications.

Figure 2:
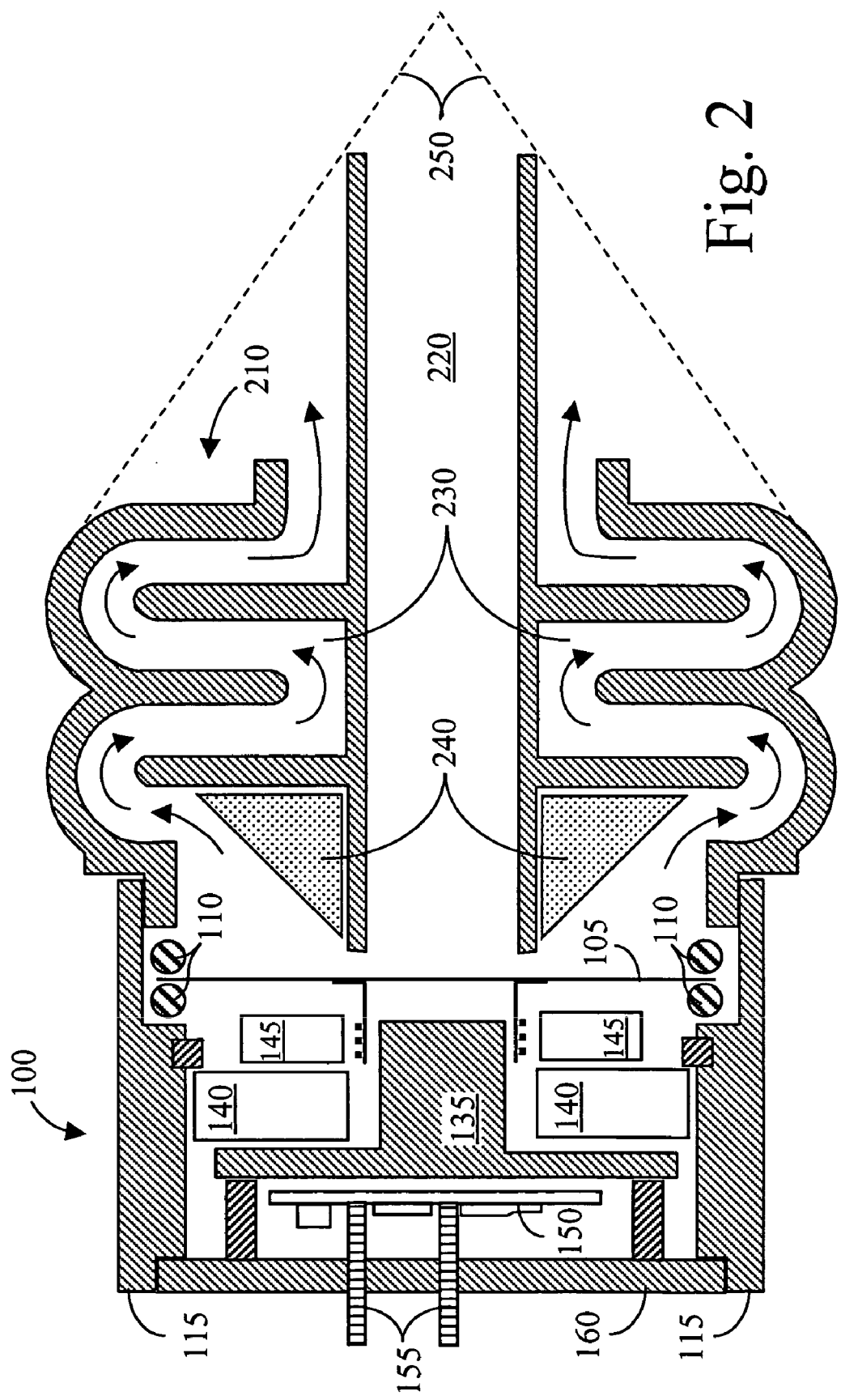
FIG. 2 is a cutaway view of a second embodiment of the alarm system of the present invention.

A second embodiment of the present invention is shown in FIG. 2, wherein only the extension housing 120 has been replaced. Instead of the extension housing 120, an acoustic lens 210 focuses the sound waves into an appropriate pattern. As with the extension housing 120, the acoustic lens is axisymmetric.

The vibrating diaphragm moves left to right causing sound to be radiated to the right in the drawing. There are two paths for the sound to follow. A center path 220 is a straight tube and provides a short path for sound to be radiated which is generated by the central portion of the diaphragm 105. In the preferred embodiment, an outer path 230 contains a plurality of switchbacks to create a longer path. A switchback is defined, herein, as a path wherein the sound changes radial direction. In the preferred embodiment, the acoustic path has a constant cross sectional area. The radial direction is in reference to the axis to which the acoustic lens is axisymmetric. The sound following the outer path 230 is generated by the outer portion of the diaphragm 105 which may be considered a ring. The acoustic lens 210 is not an impedance transformer as a horn, nor is it a resonator. The two different paths 220, 230 are intended to have equal energy of radiation at their respective outputs. The difference in physical position of the two outputs, when combined with the delay time between the two outputs, causes the radiation pattern to become unidirectional in character.

A filler block 240 is to direct the sound waves from the diaphragm 105 into the outer path 230. The filler block 240 improves the characteristics of the acoustic energy flow which reduces losses.

A nose cone 250 covers the output side of the acoustic lens 210. In the preferred embodiment, it is a thin, perforated cone of metallic material which provides mechanical protection from direct blast of water and nesting of insects to the working parts of the alarm.

Figure 3:
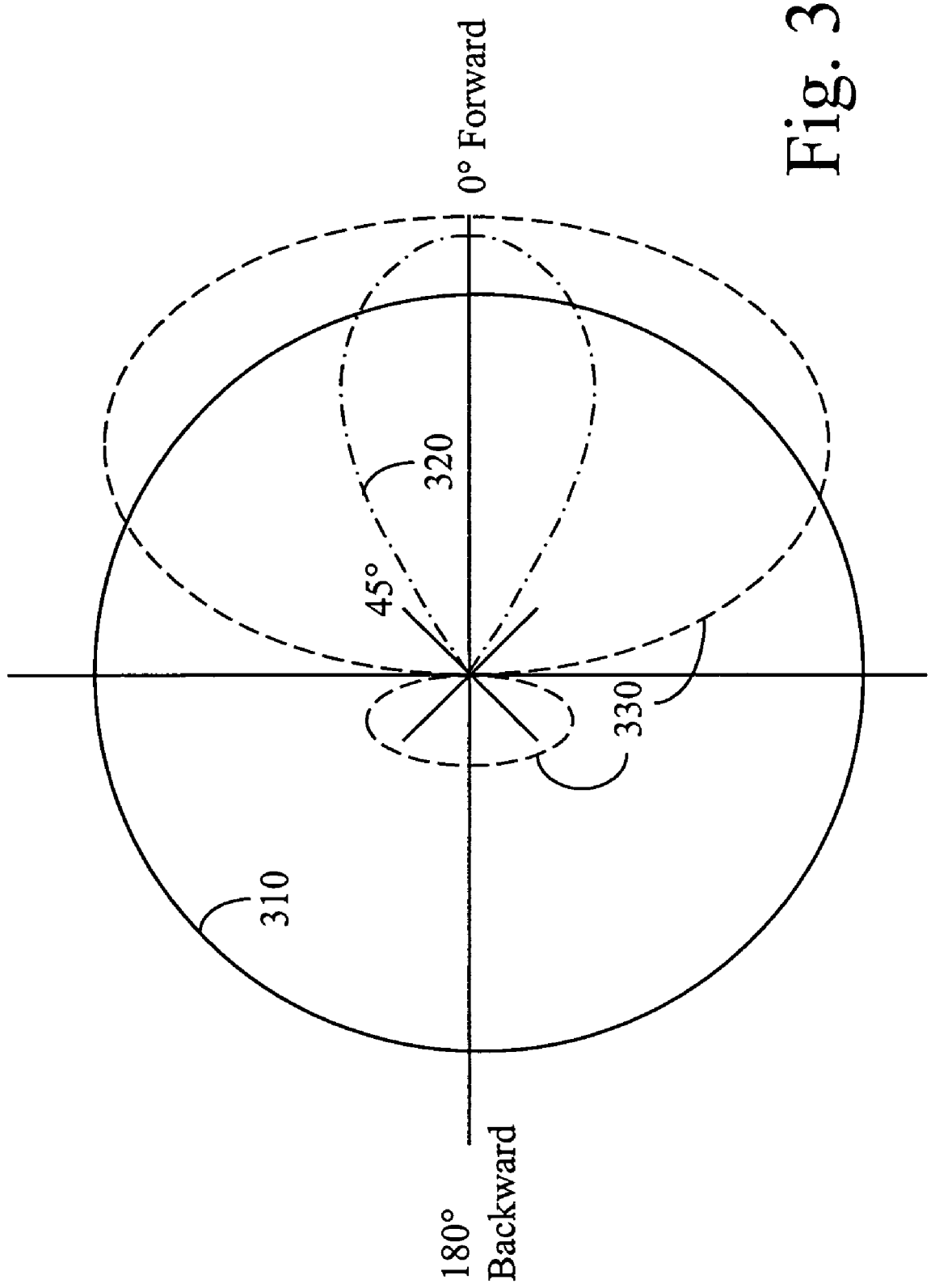
FIG. 3 is a polar plot of lines of constant-energy for alarms with various acoustic lenses.

A polar plot of curves of constant energy emanating from the alarm is shown in FIG. 3. The "forward" direction is the direction of the output of the alarm. Usually, this is the reverse direction for the vehicle on which the alarm is mounted. The solid, circular line 310 depicts the radiation pattern for an alarm having no housing or acoustic lens 210. The intent with this type of alarm is to signal all regions equally. The dot-dashed line 320 shows a typical alarm pattern for an alarm having a 60° horn. The dashed lines 330 approximate an actual radiation pattern for the alarm 100 with the acoustic lens 210 of FIG. 2. The included angle for this design is intended to be near 180°. The difference between the forward and backward sound pressure level is preferably at least 10 dB.

The polar plot of FIG. 3 shows the general character of these alarms, and should not be taken as exactly predicted responses.

Figure 4:
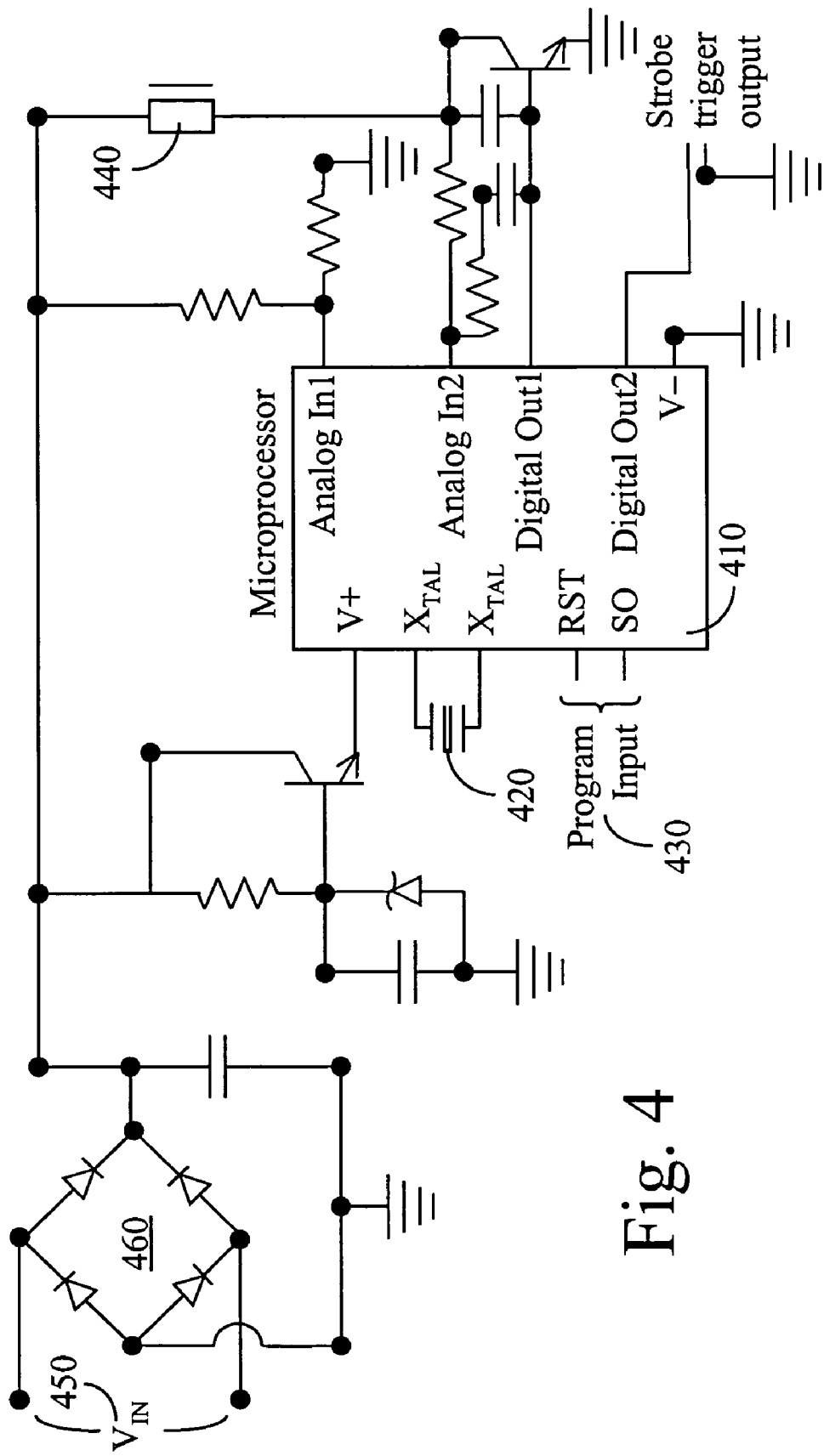
FIG. 4 is a circuit diagram for the alarm system of the present invention.

The transducer 440 (see FIG. 4) in the alarm 100 may also be used for detecting ambient noise for the purpose of modifying the output of the alarm 100 to overcome ambient noise. The directional characteristics shown by the dashed lines 330 of FIG. 3 apply to the sensed ambient sound pressure level as well as the output of the alarm 100.

A typical alarm system circuit diagram is shown in FIG. 3. The central aspect of the circuit is the microprocessor 410. A clock 420 provides timing information to the microprocessor for typical digital circuitry functions. Program input pins 430 permit characteristics and alarm signal intensity over ambient noise. Preferably, the microprocessor would have the ability to drive the alarm to generate a sound pressure level which is adjustable from 0 to 120 dB.

The pin labeled "Analog In1" detects the voltage available for alarming. The microprocessor 410 can adjust the alarm to offset high or low voltage. Analog In2 receives a signal representing ambient noise from the transducer 440. Digital Out1 is the main alarm signal output, driving the transducer 440 to produce an alarm signal. The transducer would, preferably, have more than one octave of useful bandwidth. Digital Out2 drives an optional strobe for a visible alarm signal.

A range of voltages from 6 to 50 volts DC or 4 to 35 volts AC may be applied at $V_{IN}$ 450. The full bridge rectifier 460 rectifies AC inputs to DC, and permits DC inputs to pass through substantially unchanged.

The above embodiments are the preferred embodiments, but this invention is not limited thereto. It is, therefore, apparent that many modifications and variations of the present invention are possible in light of the above teachings. It is, therefore, to be understood that within the scope of the appended claims, the invention may be practiced otherwise than as specifically described.

We claim:

1. A method for providing for an alarm connected to a source of power, the alarm comprising a microprocessor, the method comprising the steps of:
    measuring a power source voltage level;
    modifying an output of the microprocessor based on the measured source voltage level to maintain a consistent alarm signal for varying source voltages;
    wherein the alarm is audible and includes a transducer for detecting ambient noise, the method additionally comprising the steps of:
    detecting ambient noise with the transducer; and
    adjusting the output of the audible alarm based on the ambient noise.

2. The method of claim 1 wherein the source of power is an AC source.

3. The method of claim 1 wherein the source of power is a DC source.

4. The method of claim 1 wherein the microprocessor may be programmed to provide audible alarms with a plurality of arbitrary waveforms and signal characteristics.

5. The method of claim 4 wherein the plurality of arbitrary waveforms and signal characteristics include audible voice signals.

6. The method of claim 1 including a provision to provide a visual signal for alarming.

7. An alarm connected to a power source, said alarm comprising:
    a microprocessor;
    a voltmeter function within the microprocessor for measuring a power source voltage level;
    a modifying function within the microprocessor for modifying an output to the alarm based on the measured source voltage level to maintain a consistent alarm signal for varying source to voltages;
    wherein the alarm is audible and additionally comprising:
    a transducer for detecting ambient noise; and
    an adjusting function within the microprocessor for adjusting the output of the audible alarm based on the ambient noise.

8. The alarm of claim 7 wherein the source of power is an AC source.

9. The alarm of claim 8 additionally comprising a full bridge rectifier.

10. The alarm of claim 8 additionally comprising means to accommodate varying voltages from the power source without degrading the alarm signal.

11. The alarm of claim 7 wherein the source of power is a DC source.

12. The alarm of claim 7 including means to program the microprocessor to provide audible alarms with a plurality of arbitrary waveforms and signal characteristics.

13. The alarm of claim 12 including means to broadcast audible voice signals.

14. The alarm of claim 12 wherein frequencies of the signals produced by the microprocessor may vary.

15. The alarm of claim 14 wherein a frequency or a frequency range is selectable upon alarm installation.

16. The alarm of claim 7 additionally comprising a means for visual alarming.

17. A method for providing for an audible alarm connected to a source of power, the alarm comprising a microprocessor, and including a transducer for detecting ambient noise, the method comprising the steps of:

measuring a power source voltage;

modifying an output of the microprocessor based on a measured source voltage to maintain a consistent audible alarm signal for varying source voltages;

detecting ambient noise with the transducer; and adjusting the output of the audible alarm based on the ambient noise.

18. An audible alarm connected to a power source, said audible alarm comprising:

a microprocessor;

a voltmeter function within the microprocessor for measuring a power source voltage;

a modifying function within the microprocessor for modifying an output to the audible alarm based on a measured source voltage to maintain a consistent audible alarm signal for varying source voltages;

a transducer for detecting ambient noise; and an adjusting function within the microprocessor for adjusting the output of the audible alarm based on the ambient noise.

* * * * *